US007309453B2

(12) United States Patent
Chang et al.

(10) Patent No.: US 7,309,453 B2
(45) Date of Patent: Dec. 18, 2007

(54) COOLANT CAPABLE OF ENHANCING CORROSION INHIBITION, SYSTEM CONTAINING SAME, AND METHOD OF MANUFACTURING SAME

(75) Inventors: Je-Young Chang, Phoenix, AZ (US); Choong-Un Kim, Arlington, TX (US); Balu Pathangey, Scottsdale, AZ (US); Paul J. Gwin, Orangevale, CA (US); Mark E. Luke, Chandler, AZ (US); Ravi Prasher, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 11/432,879

(22) Filed: May 12, 2006

(65) Prior Publication Data

US 2007/0262286 A1    Nov. 15, 2007

(51) Int. Cl.
*C09K 5/10* (2006.01)
*C09K 5/00* (2006.01)
*F28D 15/00* (2006.01)
*H01L 23/34* (2006.01)
*H01L 23/473* (2006.01)

(52) U.S. Cl. ............... 252/75; 165/80.4; 165/80.5; 165/104.19; 165/104.28; 165/104.33; 174/15.1; 252/70; 252/71; 257/714; 257/E23.098; 361/699

(58) Field of Classification Search .......... 165/80.4, 165/80.5, 104.19, 104.28, 104.33; 174/15.1; 252/70, 71, 75; 257/714, E23.098; 361/699
See application file for complete search history.

(56) References Cited

U.S. PATENT DOCUMENTS

| | | | |
|---|---|---|---|
| 5,719,444 A | * | 2/1998 | Tilton et al. ............... 257/714 |
| 6,203,719 B1 | | 3/2001 | Turcotte et al. |
| 6,290,870 B1 | | 9/2001 | Turcotte et al. |
| 6,676,848 B2 | | 1/2004 | Maes et al. |
| 6,689,289 B1 | | 2/2004 | Maes et al. |
| 7,021,369 B2 | * | 4/2006 | Werner et al. ......... 165/104.33 |
| 2006/0131003 A1 | * | 6/2006 | Chang et al. .......... 165/104.33 |

* cited by examiner

*Primary Examiner*—Anthony J. Green

(57) ABSTRACT

A coolant capable of enhancing corrosion inhibition includes a potassium formate solution having a first concentration of a polyphosphate salt and a second concentration of dicyandiamide. In one embodiment, such a coolant may provide corrosion inhibition that is especially effective for silicon and aluminum, among other materials. The corrosion protection may be enhanced for certain materials by adding benzotriazole in a third concentration to the potassium formate solution.

35 Claims, 4 Drawing Sheets

COOLANT CAPABLE OF ENHANCING CORROSION INHIBITION, SYSTEM CONTAINING SAME, AND METHOD OF MANUFACTURING SAME

FIELD OF THE INVENTION

The disclosed embodiments of the invention relate generally to the thermal performance of computer systems, and relate more particularly to the corrosion performance of coolants in such systems.

BACKGROUND OF THE INVENTION

It is well known that microprocessors and other electronic devices in computer systems generate heat as a result of electrical activity taking place within the electronic devices. The heat must be managed so that it does not damage such devices or negatively affect their performance. Accordingly, many microprocessors are associated with a liquid cooling loop in which is circulated a coolant capable of transferring heat away from the microprocessor, thereby cooling the microprocessor to an acceptable temperature.

Because of its excellent thermal properties, water is widely used as a major component of coolants in computer cooling systems. An anti-freezing agent (antifreeze) is typically added to the water in order to provide freeze protection for the coolant. Potassium formate is one of the best anti-freezing agents currently available, but potassium formate is also highly corrosive to silicon, copper, aluminum, silver, and other metallic and non-metallic substances that are likely to be present in the cooling system. Corrosion byproducts within the cooling system can interfere with heat transfer, which may subsequently cause overheating and failure of the microprocessor or other electronic device.

The general practice for reducing such corrosion risk is to add corrosion inhibitors to the coolant. But conventional corrosion inhibitors do not provide adequate corrosion protection against the pitting, crevice, and deposit attack corrosion phenomena that are seen with aluminum, silicon and silicon-based materials, and various light metal alloys. Furthermore, corrosion inhibition in microelectronics poses challenges and is subject to sensitivities not seen in other applications (such as, for example, automotive cooling systems) because microelectronic cooling systems use a relatively small amount of coolant for a relatively large internal surface area. The large ratio of surface area to coolant volume (the A/V ratio) that results demands that the makeup of corrosion inhibitors in the microelectronics coolant be chosen more carefully and effectively than in other cooling situations because such inhibitors tend to be much more quickly consumed. Furthermore, any amount of corrosion that does occur, however minor and whether due to poor selection of corrosion inhibitors or some other reason, can produce a serious acceleration in the corrosion rate—far more serious than what would typically be encountered in cooling situations outside of the microelectronics arena. Accordingly, there exists a need for a coolant capable of providing high levels of corrosion protection to silicon, aluminum, aluminum alloys, copper, and other components of microprocessor cooling systems.

BRIEF DESCRIPTION OF THE DRAWINGS

The disclosed embodiments will be better understood from a reading of the following detailed description, taken in conjunction with the accompanying figures in the drawings in which.

Figure 1:
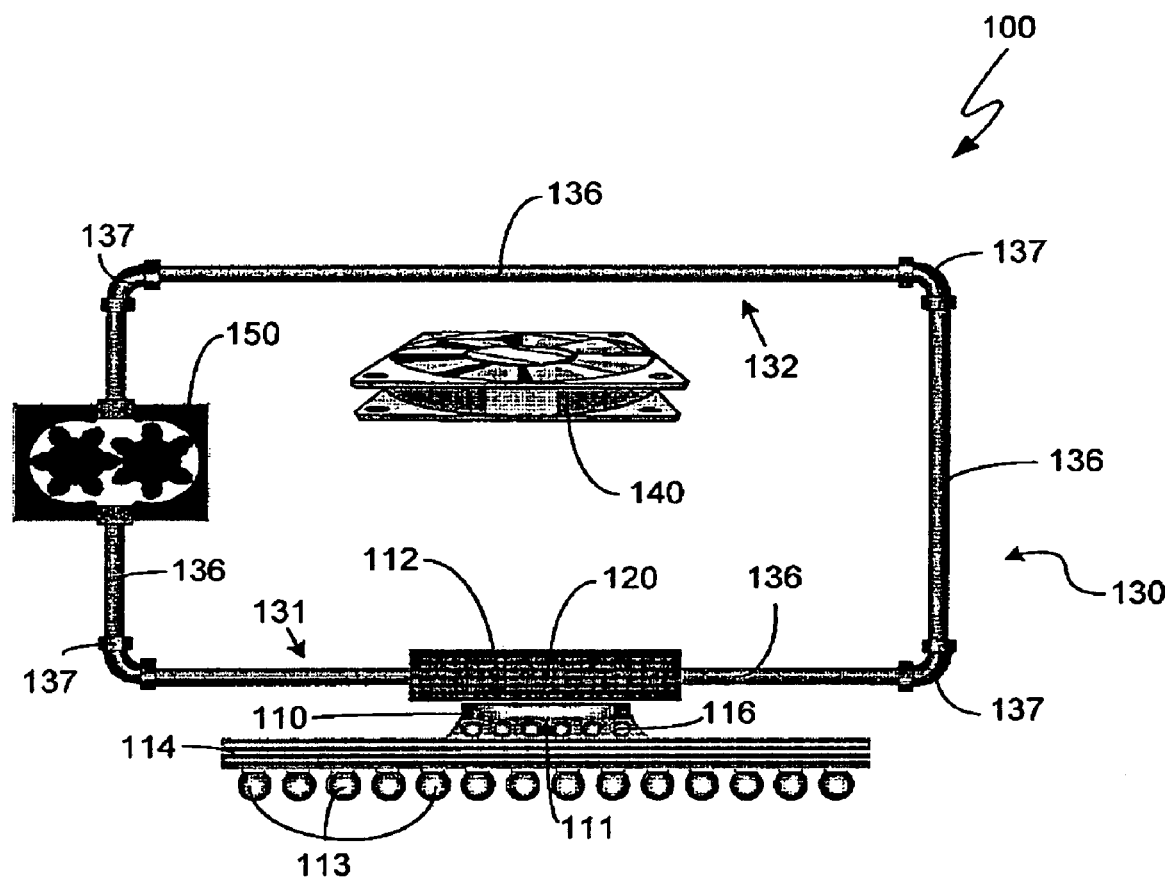
FIG. 1 is a schematic representation of a liquid cooling system in which an embodiment of the invention may be used.

For simplicity and clarity of illustration, the drawing figures illustrate the general manner of construction, and descriptions and details of well-known features and techniques may be omitted to avoid unnecessarily obscuring the discussion of embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a coolant capable of enhancing corrosion inhibition comprises a potassium formate solution containing a first concentration of a polyphosphate salt and a second concentration of dicyandiamide (DCD). In one embodiment, such a coolant may provide corrosion inhibition that is especially effective for silicon and aluminum, among other materials.

Referring now to the figures, FIG. 1 is a schematic representation of one embodiment of a package-based liquid cooling system 100 in which an embodiment of the disclosed coolant may be used. The disclosed coolant may also be used in cooling systems different from the one illustrated in FIG. 1.

As illustrated in FIG. 1, cooling system 100 comprises a processing device 110 such as an integrated circuit die disposed on a substrate 114 to which it is attached via solder bumps 116 or other first line interconnect. Solder balls 113 form part of a ball grid array or other second line interconnect connecting substrate 114 to a system board (not shown). Processing device 110 has a front side 111 and a back side 112. A heat spreader 120 which, for example, may be a cold plate, a microchannel, a heat sink, or the like, is positioned adjacent to back side 112 of processing device 110 and attached thereto via thermal interface materials such as solder or polymer materials. Alternatively, microchannels could be implemented directly at back side 112 of processing device 110. It will be understood that the foregoing is merely an exemplary mounting scheme and is not meant to be limiting. In an alternative embodiment, for example, processing device 110 may be electrically coupled to various other systems, components, or devices.

A cooling loop 130 has a portion 131 adjacent to heat spreader 120 and a portion 132 spaced apart from portion 131. Cooling loop 130 comprises cooling tubes 136 connected to each other with connectors 137. A cooling device 140, such as a cooling fan or the like, is positioned adjacent to portion 132. A coolant (not shown) circulates in cooling loop 130.

The coolant helps cool processing device 110 by assisting in the transfer of heat away from processing device 110. More specifically, heat from processing device 110 enters heat spreader 120 via thermal conduction and raises the temperature of the portion of the coolant that is in and near heat spreader 120 and portion 131 of cooling loop 130. As the heated portion of the coolant flows around cooling loop 130, as, for example, under the impetus of a pump 150 in line with cooling loop 130, it eventually reaches portion 132 of cooling loop 130, where its temperature drops due to the action of cooling device 140. It then returns to heat spreader 120 and the heat exchange cycle is repeated.

Conventional substances added to commercially available liquid coolants for the purpose of inhibiting corrosion include polyphosphates, amine or ammonium salts, organic carboxylate acids, flourocarboxylates, and the like, but none of these additives provide adequate corrosion protection against pitting, crevicing, and deposit attack corrosion phenomena. Silicon, aluminum, various light metal alloys, and the like are particularly susceptible to such corrosion, yet no currently-available commercial coolant provides adequate corrosion protection for such materials in the computer cooling systems.

As mentioned above, solutions comprising potassium formate in water are widely used as coolants in cooling systems because water is a very good medium for heat removal and because potassium formate is a very effective antifreeze. However, as also mentioned, potassium formate is highly corrosive to silicon, copper, aluminum, silver, and other metals, as well as metal alloys and non-metallic materials likely to be present in the cooling system, including brass, stainless steel, brazing and solder materials, and the like. In a typical cooling system potassium formate is in direct physical contact with such materials, meaning corrosion is of immediate concern from a perspective of long-term reliability. Typically, corrosion occurs via electrochemical reactions at the interface between a solid surface and an electrolyte based antifreeze liquid solution. A widely used potassium formate-based liquid coolant containing conventional aromatic triazole corrosion inhibitors provides adequate, though not significant, corrosion protection for copper but has shown severe corrosion behavior for aluminum and silicon based materials.

To further illustrate the problem, consider that in one embodiment heat spreader 120 is a microchannel. As an example, the microchannel includes a set of silicon or copper channels that may have a width of approximately 50 micrometers and a depth of approximately 300 micrometers. Exposure of the surface area of the micrometer-sized channels to the fixed volume of liquid coolant increases the risk of significant corrosion due to the presence of various ions at temperatures near 100° Celsius. Furthermore, corrosion products within the microchannels can interfere with heat transfer, which may subsequently cause overheating and failure of processing device 110 and/or other parts of the system being cooled.

More specifically, a corrosion rate equivalent to 100 micrometers per year has been observed for currently-available coolants. Such aggressive corrosion is capable of destroying or severely damaging a microchannel of the dimensions described above in a time period of just a few months, meaning that such coolants are inadequate for corrosion protection over a normal life cycle of a computer processor.

In one embodiment of the invention, a coolant capable of enhancing corrosion prevention, including for materials such as silicon, aluminum, copper, and the like, comprises a potassium formate solution containing a polyphosphate salt in a first concentration and dicyandiamide (which is sometimes referred to as cyanoguanidine) in a second concentration. In certain embodiments of the invention the coolant further comprises benzotriazole in a third concentration. In the same or other embodiments the coolant still further comprises phosphoric acid in a fourth concentration.

The potassium formate solution, in at least one embodiment, comprises a mixture of potassium formate and water in which the potassium formate represents no more than approximately 55 percent by weight of the potassium formate solution. The stated concentration represents the eutectic point for the potassium formate solution, meaning any increase in the concentration of potassium formate beyond 55 percent by weight will result in an increase in ice formation points. In the same or another embodiment, the potassium formate represents no less than approximately 30 percent by weight of the potassium formate solution. In a particular embodiment, the potassium formate represents between approximately 30 percent by weight and approximately 42 percent by weight of the potassium formate solution.

In one embodiment, the concentration of the polyphosphate salt in the potassium formate solution, which concentration is referred to above as the first concentration, is no more than approximately 0.5 percent by weight of the potassium formate solution. In the same or another embodiment, the concentration of dicyandiamide in the potassium formate solution, which concentration is referred to above as the second concentration, is no more than approximately 0.1 percent by weight of the potassium formate solution. In the same or another embodiment, the concentration of benzotriazole in the potassium formate solution, which concentration is referred to above as the third concentration, is no more than approximately 0.02 percent by weight of the potassium formate solution.

It was mentioned above that the potassium formate solution contains a polyphosphate salt. In one embodiment, the polyphosphate salt comprises tri-sodium polyphosphate (NaPP) in a concentration of no more than approximately 0.4 percent by weight of the potassium formate solution. In a different embodiment, the polyphosphate salt comprises di-potassium polyphosphate (DPP) or another potassium polyphosphate in a concentration of no more than approximately 0.2 percent by weight of the potassium formate solution.

The anti-corrosion qualities of the potassium formate solution may be enhanced if the pH of the solution is adjusted to be between approximately 7 and 9. In certain embodiments, a pH at or near 8 is an advantageous pH level. The pH level of the solution may be adjusted using phosphoric acid, which is not itself corrosive and is thus well suited to be an additive to an anti-corrosion solution. In one embodiment, the phosphoric acid is present in the potassium formate solution in what is referred to above as a fifth concentration, which concentration may be, depending on the particular additives used in a particular embodiment, as much as approximately 0.3 percent by weight of the potassium formate solution. Such a concentration, in at least one embodiment, is sufficient to bring the pH of the solution into the stated range.

Figure 2:
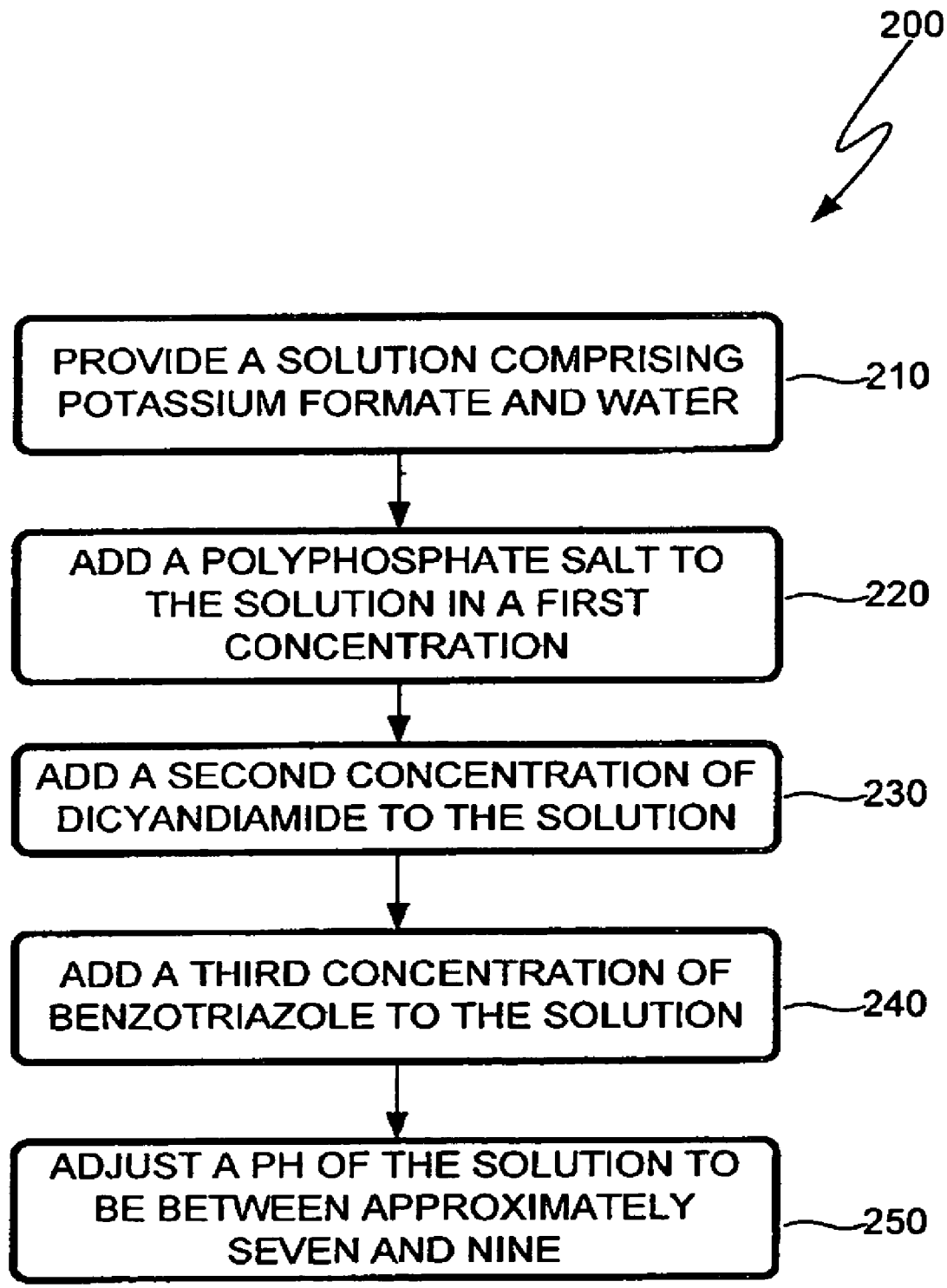
FIG. 2 is a flowchart illustrating a method of manufacturing a coolant capable of enhancing corrosion inhibition according to an embodiment of the invention.

FIG. 2 is a flowchart illustrating a method 200 of manufacturing a coolant capable of enhancing corrosion inhibition according to an embodiment of the invention. A step 210 of method 200 is to provide a solution comprising potassium formate and water. As an example, step 210 can comprise providing the potassium formate in a concentration of not more than approximately 55 percent by weight of the solution. As a particular example, step 210 can comprise providing the potassium formate in a concentration of between approximately 30 percent by weight and approximately 42 percent by weight of the solution.

A step 220 of method 200 is to add a polyphosphate salt to the solution in a first concentration. As an example, the first concentration can represent up to 0.5 percent by weight of the solution. In one embodiment, step 220 can comprise adding tri-sodium polyphosphate in a concentration of no more than approximately 0.4 percent by weight of the solution. In another embodiment, step 220 can comprise adding di-potassium polyphosphate in a concentration of no more than approximately 0.2 percent by weight of the solution.

A step 230 of method 200 is to add a second concentration of dicyandiamide to the solution. As an example, step 230 can comprise adding the dicyandiamide in a concentration of no more than approximately 0.1 percent by weight of the solution.

A step 240 of method 200 is to add a third concentration of benzotriazole to the solution. As an example, step 240 can comprise adding the benzotriazole in a concentration of no more than approximately 0.02 percent by weight of the solution. Step 240 is an optional step that, when performed, may enhance the ability of the potassium formate solution to protect against corrosion of copper as well as possibly other materials. The potassium formate solution, however, may in at least one embodiment protect at least silicon and aluminum even if step 240 is not performed, i.e., even if benzotriazole is not added to the potassium formate solution. Furthermore, the potassium formate solution may still provide a high level of protection for copper even if step 240 is not performed.

In one embodiment, steps 220-240 may all be performed simultaneously. In other words, the stated substances may each be added in the stated concentrations to the potassium formate solution provided in step 210 at roughly the same time. In another embodiment, steps 220-240 may be performed sequentially in the order presented above or in any other order.

A step 250 of method 200 is to adjust a pH of the solution to be between approximately seven and nine. As an example, step 250 can be performed by adding phosphoric acid to the potassium formate solution. As a particular example, step 250 can comprise adjusting the pH to be approximately eight, using phosphoric acid or another substance. Like steps 220, 230, and 240, step 250 may be performed at any point during the manufacturing process after the potassium formate solution has been provided (step 210).

Figure 3:
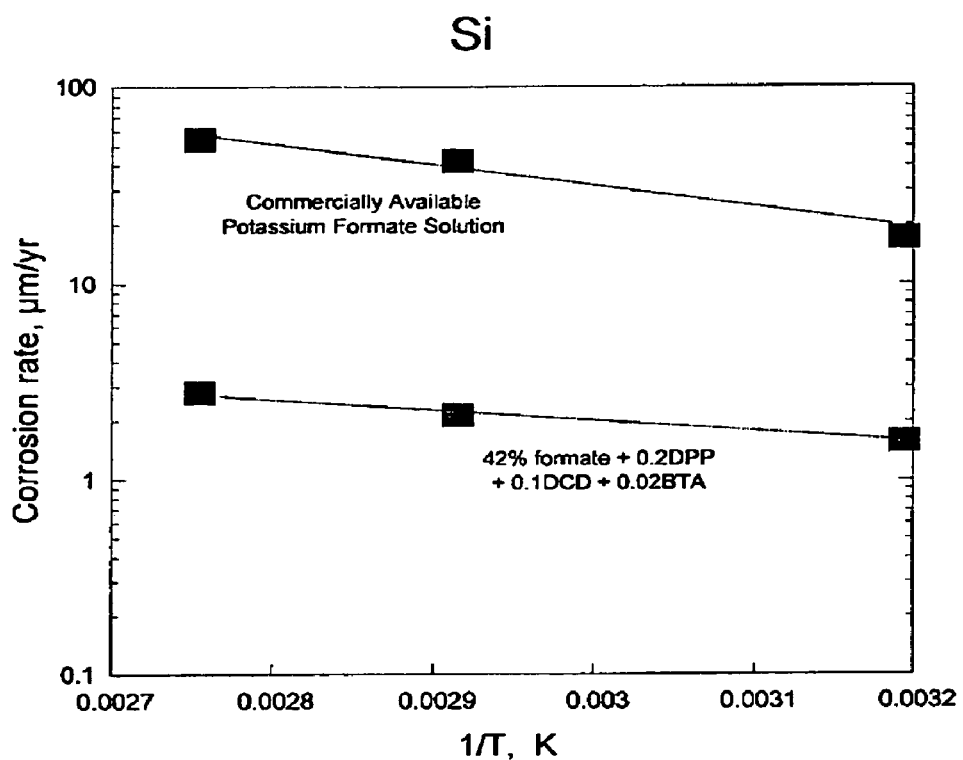
FIGS. 3-5 are graphs depicting the corrosion performance, for silicon, an aluminum alloy, and copper, respectively, of embodiments of the potassium formate solution as well as of a typical commercially-available coolant.
Figure 4:
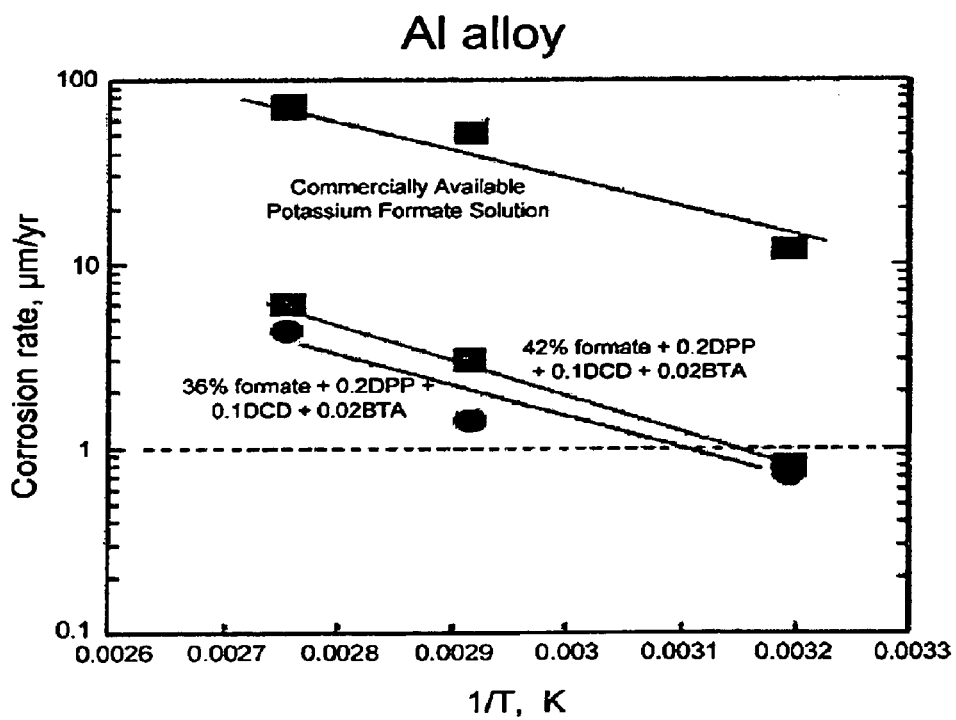
Figure 5:
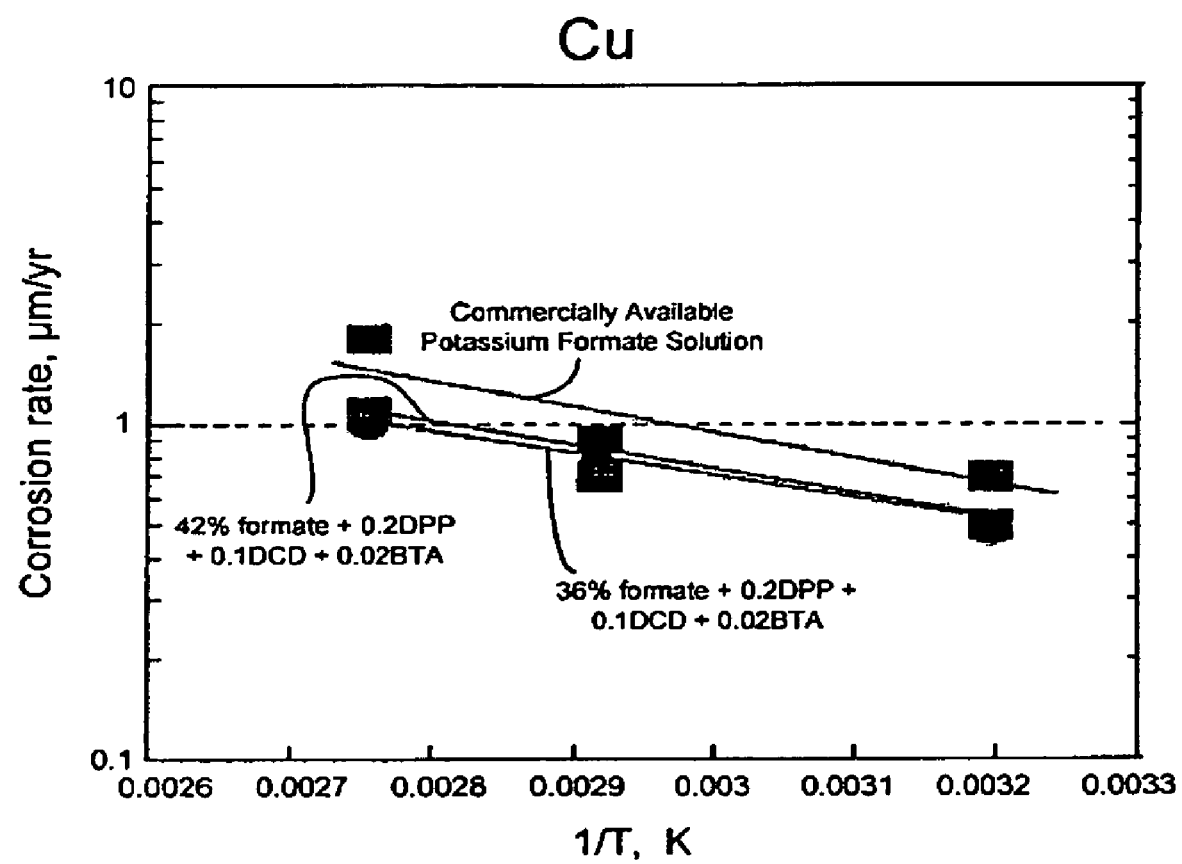

FIGS. 3-5 are graphs depicting the corrosion performance, for silicon, an aluminum alloy, and copper, respectively, of embodiments of the potassium formate solution as well as of a typical commercially-available coolant. For each graph in FIGS. 3-5: (a) the vertical axis measures, on a logarithmic scale, the corrosion rate for the respective material (silicon, the aluminum alloy, or copper) in units of micrometers per year; and (b) the horizontal axis measures the inverse temperature of the potassium formate solution in degrees Kelvin. The data on the graphs are for: (a) a typical commercially-available water-based solution with potassium formate; (b) a water-based solution comprising 42 percent by weight potassium formate, 0.2 percent by weight DPP, 0.1 percent by weight DCD, and 0.02 percent by weight BTA; and, for FIGS. 4 and 5 only, (c) a water-based solution comprising 36 percent by weight potassium formate, 0.2 percent by weight DPP, 0.1 percent by weight DCD, and 0.02 percent by weight BTA. (FIG. 3, directed to silicon, does not include data for the 36 percent potassium formate solution.)

The aluminum alloy for which data are shown in FIG. 4 is Al 3003 clad with Al 4343. This alloy is one that is very commonly used for industrial heat exchangers. As known in the art, Al 3003 is composed of 0.19 percent copper, 0.3 percent iron, 0.6 percent magnesium, 0.05 percent manganese, 0.41 percent silicon, and 0.01 percent zinc, with the remainder being aluminum. Al 4343 is composed of 0.005 percent copper, 0.8 percent iron, 0.01 percent magnesium, 0.01 percent manganese, 6.9 percent silicon, 0.01 percent titanium, and 0.01 percent zinc, with the remainder being aluminum.

For each graph, the data were obtained by performing high temperature testing procedures according to the ASTM G102 and ASTM G5-94 standards. The data were obtained at an A/V ratio (surface area of target metal exposed to liquid solution divided by total liquid volume in the system) of 4 square centimeters per milliliter ($cm^2$/ml) after 20 hours of immersion in the respective coolant. The data were obtained using a test cell capable of properly defining corrosion behaviors in environments having high A/V ratios. It should be noted that the corrosion rate for the aluminum alloy (FIG. 4) is over-estimated due to silicon local corrosion; however the over-estimation is roughly the same for each of the three coolants for which data is shown so that the comparison of the corrosion rates is accurate.

FIGS. 3-5 show that the corrosion performance, i.e., the ability of the solutions to resist corrosion, for both the 42 percent and the 36 percent solutions according to embodiments of the invention is significantly superior to the corrosion performance for the commercially-available coolant solution. For the aluminum alloy and silicon the increase in corrosion performance for the illustrated embodiments is greater than an order of magnitude. For copper the increase in corrosion performance for the illustrated embodiments is not as pronounced but is still an improvement of roughly 200-300 percent. The corrosion performance may be even better, though perhaps only slightly so, if the DPP in the 36 percent and the 42 percent solutions is replaced by 0.4 percent by weight NaPP. As indicated, the test results suggest that at least certain embodiments of the invention perform better than the best currently-available antifreeze solutions in terms of corrosion protection for at least copper, aluminum alloys, and silicon.

Although the invention has been described with reference to specific embodiments, it will be understood by those of ordinary skill in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the anti-corrosion solution and its method of manufacture as discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A coolant capable of enhancing corrosion inhibition, the coolant comprising:
   a potassium formate solution;
   a first concentration of a polyphosphate salt in the potassium formate solution; and
   a second concentration of dicyandiamide in the potassium formate solution.

2. The coolant of claim 1 further comprising:
   a third concentration of benzotriazole in the potassium formate solution.

3. The coolant of claim 2 wherein:
   the third concentration represents no more than approximately 0.02 percent by weight of the potassium formate solution.

4. The coolant of claim 1 further comprising:
   a fourth concentration of phosphoric acid in the potassium formate solution.

5. The coolant of claim 1 wherein:
   the potassium formate solution comprises a mixture of potassium formate and water.

6. The coolant of claim 5 wherein:
   the potassium formate represents no more than approximately 55 percent by weight of the potassium formate solution.

7. The coolant of claim 6 wherein:
   the potassium formate represents no less than approximately 30 percent by weight of the potassium formate solution.

8. The coolant of claim 7 wherein:
   the potassium formate represents between approximately 30 percent by weight and approximately 42 percent by weight of the potassium formate solution.

9. The coolant of claim 1 wherein:
   the first concentration represents no more than approximately 0.5 percent by weight of the potassium formate solution.

10. The coolant of claim 1 wherein:
    the second concentration represents no more than approximately 0.1 percent by weight of the potassium formate solution.

11. The coolant of claim 1 wherein:
    the polyphosphate salt comprises tri-sodium polyphosphate.

12. The coolant of claim 11 wherein:
    the first concentration represents no more than approximately 0.4 percent by weight of the potassium formate solution.

13. The coolant of claim 1 wherein:
    the polyphosphate salt comprises di-potassium polyphosphate.

14. The coolant of claim 13 wherein:
    the first concentration represents no more than approximately 0.2 percent by weight of the potassium formate solution.

15. The coolant of claim 1 wherein:
    a pH level of the potassium formate solution is between approximately seven and nine.

16. The coolant of claim 15 wherein:
    the pH level of the potassium formate solution is approximately eight.

17. A method of manufacturing a coolant capable of enhancing corrosion inhibition, the method comprising:
    providing a solution comprising potassium formate and water;
    adding a polyphosphate salt to the solution in a first concentration; and
    adding a second concentration of dicyandiamide to the solution.

18. The method of claim 17 further comprising:
    adding a third concentration of benzotriazole to the solution.

19. The method of claim 18 wherein:
    adding the third concentration of benzotriazole comprises adding the benzotriazole in a concentration of no more than approximately 0.02 percent by weight of the solution.

20. The method of claim 17 wherein:
    providing the solution comprises providing the potassium formate in a concentration of not more than approximately 55 percent by weight of the solution.

21. The method of claim 17 wherein:
    providing the solution comprises providing the potassium formate in a concentration of between approximately 30 percent by weight and approximately 42 percent by weight of the solution.

22. The method of claim 21 wherein:
    adding the polyphosphate salt comprises adding tri-sodium polyphosphate in a concentration of no more than approximately 0.4 percent by weight of the solution.

23. The method of claim 21 wherein:
    adding the polyphosphate salt comprises adding di-potassium polyphosphate in a concentration of no more than approximately 0.2 percent by weight of the solution.

24. The method of claim 21 wherein:
    adding the second concentration of dicyandiamide comprises adding the dicyandiamide in a concentration of no more than approximately 0.1 percent by weight of the solution.

25. The method of claim 17 further comprising:
    adjusting a pH of the solution to be between approximately seven and nine.

26. The method of claim 25 wherein:
adjusting the pH of the solution comprises adjusting the pH using phosphoric acid.

27. The method of claim 26 wherein:
adjusting the pH of the solution comprises adjusting the pH to be approximately eight.

28. A system comprising:
a board;
a processing device disposed on the board, the processing device having a front side and a back side;
a heat spreader adjacent to the back side of the processing device;
a cooling loop having a first portion adjacent to the heat spreader and a second portion spaced apart from the first portion;
a cooling device adjacent to the second portion of the cooling loop; and
a coolant in the cooling loop,
wherein:
   the coolant is a water-based solution comprising:
      a first percentage by weight of potassium formate;
      a second percentage by weight of a polyphosphate salt; and
      a third percentage by weight of dicyandiamide.

29. The system of claim 28 further comprising:
a pump coupled to the cooling loop.

30. The system of claim 28 wherein:
the coolant further comprises a fourth percentage by weight of benzotriazole.

31. The system of claim 30 wherein:
the first percentage by weight is between approximately 30 and 55;
the second percentage by weight is between approximately 0.2 and 0.5;
the third percentage by weight is approximately 0.1; and
the fourth percentage by weight is approximately 0.02.

32. The system of claim 31 wherein:
the coolant further comprises a fifth percentage by weight of phosphoric acid; and
the fifth percentage by weight is no greater than approximately 0.3.

33. The system of claim 31 wherein:
the coolant has a pH of approximately eight.

34. The system of claim 33 wherein:
the polyphosphate salt comprises tri-sodium polyphosphate; and
the second percentage by weight is approximately 0.4.

35. The system of claim 33 wherein:
the polyphosphate salt comprises di-potassium polyphosphate; and
the second percentage by weight is approximately 0.2.

* * * * *